(12) United States Patent
Wilstrup et al.

(10) Patent No.: US 6,356,850 B1
(45) Date of Patent: Mar. 12, 2002

(54) METHOD AND APPARATUS FOR JITTER ANALYSIS

(75) Inventors: Jan B. Wilstrup, Mounds View, MN (US); Dennis M. Petrich, San Jose, CA (US)

(73) Assignee: Wavecrest Corporation, Eden Prairie, MN (US)

( * ) Notice: Subject to any disclaimer, the term of this patent is extended or adjusted under 35 U.S.C. 154(b) by 0 days.

(21) Appl. No.: 09/240,742

(22) Filed: Jan. 29, 1999

Related U.S. Application Data

(60) Provisional application No. 60/073,276, filed on Jan. 30, 1998.

(51) Int. Cl.$^7$ .............................................. G01R 13/00

(52) U.S. Cl. ........................... 702/69; 702/66; 702/106; 702/124; 702/190

(58) Field of Search ........................... 702/69, 66, 106, 702/124, 190

(56) References Cited

U.S. PATENT DOCUMENTS

| 5,220,581 A | * | 6/1993 | Ferraiolo et al. ............. 375/10 |
| 5,467,464 A | * | 11/1995 | Oprescu et al. ............. 395/550 |
| 5,999,561 A | * | 12/1999 | Naden et al. ................. 375/206 |
| 6,185,509 B1 | * | 2/2001 | Wilstrup et al. ............. 702/69 |

FOREIGN PATENT DOCUMENTS

| EP | 0 543 139 B1 | 5/1993 |
| WO | WO 89/01191 | 2/1989 |
| WO | WO 97/07611 | 2/1997 |

* cited by examiner

*Primary Examiner*—Arthur T. Grimley
*Assistant Examiner*—John Le
(74) *Attorney, Agent, or Firm*—Merchant & Gould P.C.

(57) ABSTRACT

A method, apparatus, and article of manufacture for separating the components of a jitter signal. The method includes the steps of obtaining measurements of the spans of a signal, generating variation measurements for each of the spans, transforming the variation estimates from a time domain to a frequency domain, and determining the random component and the periodic component of the jitter signal.

37 Claims, 12 Drawing Sheets

REF PATERN

ROTATE CCW

ROTATE CCW

ROTATE CCW

METHOD AND APPARATUS FOR JITTER ANALYSIS

BACKGROUND OF THE INVENTION

This application claims the benefit of priority of Provisional Application No. 60/073,276, entitled "Data Comm Jitter Analysis System," filed Jan. 30, 1998.

FIELD OF THE INVENTION

This invention relates in general to measurement apparatus and method; more particularly, to a system and method for analyzing components of a signal; and more particularly still, to a system and method for analyzing jitter in a serial data signal.

DESCRIPTION OF RELATED ART

Jitter in serial data communication is a difference of data transition times relative to ideal bit clock active transition times. Jitter represents a deviation, typically in picoseconds, from the ideal. As data transfer rates increase within semiconductor devices and other high speed applications increase, the jitter component may become more significant. For example, in video graphics chips, jitter can cause a flicker or jumping of the video image. Also, in serial data communication systems jitter will cause errors. In order to understand the effects that jitter may have on semiconductor devices and data communication systems, measurements of jitter and other aspects of timing are critical during the prototyping stages and production tests.

Jitter has four major components, inter-symbol interference (ISI), Duty Cycle Distortion (DCD), periodic jitter (PJ), and random jitter (RJ). ISI is caused by a data path propagation delay that is a function of past data history and occurs in all finite bandwidth data paths. DCD is caused by differing propagation delays for positive and negative data transitions. PJ is caused by one or more sine waves and its/their harmonics. RJ is assumed to be Gaussian (normal) and has a power spectral density that is a function of frequency.

ISI, DCD and PJ are all bounded. They may be described as a peak or peak to peak value in bit period, unit interval (UI), or seconds. PJ in general has a magnitude for each spectral line.

RJ is unbounded. It may be described by a standard deviation in UIs or seconds. In production testing a jitter tolerance mask is used to mimic the behavior of an actual data communications receiver in that it rejects low frequency jitter. A jitter tolerance mask is a function that is defined in the frequency domain. It has a magnitude that is a function of frequency. In most serial data communications systems, the data/clock recovery circuit tolerates low frequency jitter more than high frequency jitter and the shape of the mask reflects this fact.

An analysis of the jitter components is valuable to the product designer and tester. For example, measuring PJ helps determine whether there is cross-talk on a circuit. Analyzing ISI and DCD permits the cause of the bit error rate to be determined.

The present available measurement instruments, however, do not separate the jitter components. For example, oscilloscopes show jitter as an overall distribution without a separation of RJ and PJ. Although spectrum analyzers may measure jitter, they typically cannot be used on data streams. Moreover, when a spectrum analyzer measures a jitter value it does not separate PJ and RJ.

Bit error test equipment allows a serial data pattern to be compared with a test pattern. Although a bit error rate is determined, no information is provided about any of the jitter components of the bit error rate. The relative proportions of the components is undetermined. Also, bit error test equipment provides a slow method of estimating bit error rate. Two hours is typically necessary to estimate the bit error rate with statistical confidence for a bit rate of one gb/s.

The present invention provides a solution to this and other problems, and offers other advantages. Indeed, various embodiments construed in accordance with the principles of the present invention include the advantages of measuring jitter components without the need of a bit clock, performing statistical checks on measurements, and generating a statistical prediction of the failure rate.

SUMMARY OF THE INVENTION

The present invention discloses a method, apparatus, and article of manufacture for analyzing jitter. Inter-symbol interference, duty cycle distortion, random jitter and periodic jitter are measured. The method includes the steps of obtaining measurements of the spans of a signal, generating variation measurements for each of the spans, transforming the variation estimates from a time domain to a frequency domain, and determining the random component and the periodic component of the jitter signal.

Another embodiment provides for the measurement of ISI, DCD, RJ and PJ in serial data communications. The method includes the steps of measuring a unit interval of the data pattern, determining a matching pattern, calculating a measurement schedule defining a measurement set for each span, obtaining a plurality of measurements for many of the spans, generating variation estimates each of the spans, transforming the variation estimates from a time domain to a frequency domain, and determining the random component and the periodic component of the signal. The random and periodic components are determined through the application of a constant false alarm filter.

According to another aspect of the invention, there is provided an apparatus for measuring jitter in a signal having a repetitive data pattern. The apparatus comprises a measurement apparatus for collecting data and an analyzing unit for analyzing the signal and determining the random component and the periodic component of the signal.

According to yet another aspect of the invention, there is provided an article of manufacture comprising a program storage medium for storing instructions to execute method steps for analyzing jitter in a signal and for determining the random component and the periodic component of the signal.

BRIEF DESCRIPTION OF THE DRAWINGS

Referring now to the drawings in which like reference numbers represent corresponding parts throughout.

DETAILED DESCRIPTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
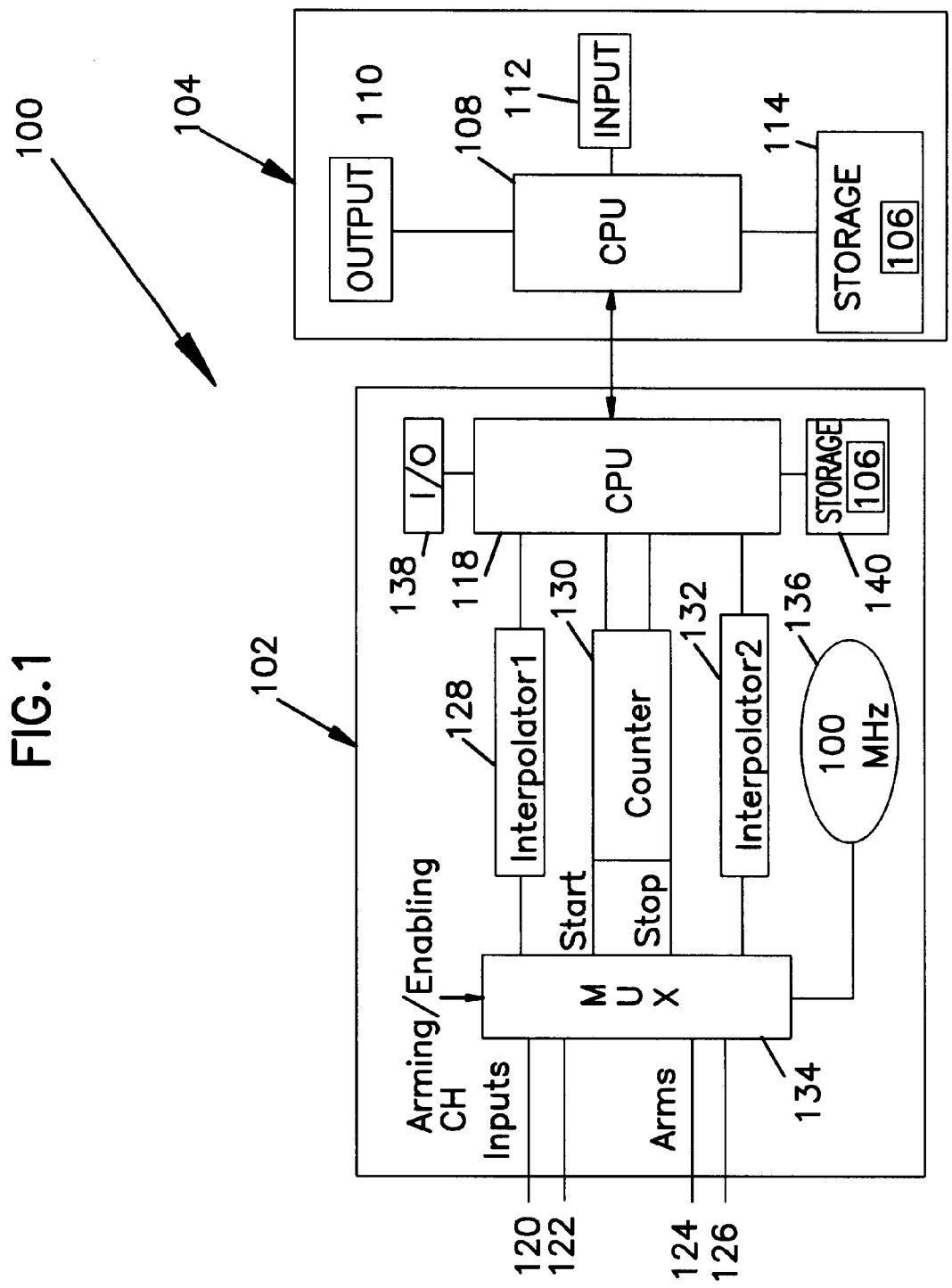
FIG. 1 is an exemplary illustration of a representative hardware environment for a signal analyzing system according to an embodiment of the present invention.

FIG. 1 is an exemplary illustration of a representative hardware environment for a signal analyzing system 100 according an embodiment of the present invention. A typical configuration may include a measurement apparatus 102 that measures the time interval between two events (start and stop) through counters.

A measurement apparatus is disclosed in U.S. Pat. No. 4,908,784, which is hereby incorporated by reference. A typical measurement apparatus is the Wavecrest DTS-2075, available from Wavecrest Corporation, Edina, Minn.

Those skilled in the art will recognize that other systems that enable signal/distribution analysis that are based on real world measurement (i.e., measurements that are non-ideal or subject to uncertainty) would be applicable.

The measurement apparatus 102 interfaces to a workstation 104 and operates under the control of an analysis program 106 resident on the workstation 104. The analysis program 106 is typically implemented through data analysis software. One commercially available analysis software is the Wavecrest Virtual Instrument (VI) software, available from Wavecrest Corporation, Edina, Minn. The workstation 104 comprises a processor 108 and a memory including random access memory (RAM), read only memory (ROM), and/or other components. The workstation 104 operates under control of an operating system, such as the UNIX® or the Microsoft® Windows NT operating system, stored in the memory to present data to the user on the output device 110 and to accept and process commands from the user via input device 112, such as a keyboard or mouse.

The analysis program 106 of the present invention is preferably implemented using one or more computer programs or applications executed by the workstation 104. Those skilled in the art will recognize that the functionality of the workstation 104 may be implemented in alternate hardware arrangements, including a configuration where the measurement apparatus 102 includes CPU 118, memory 140, and I/O 138 capable of implementing some or all of the steps performed by the analysis program 106. Generally, the operating system and the computer programs implementing the present invention are tangibly embodied in a computer-readable medium, e.g. one or more data storage devices 114, such as a ZIP® drive, floppy disc drive, hard drive, CD-ROM drive, firmware, or tape drive. However, such programs may also reside on a remote server, personal computer, or other computer device.

The analysis program 106 provides for different measurement/analysis options and measurement sequences. The analysis program 106 interacts with the measurement apparatus 102 through the on-board CPU 118. In one embodiment, the measurement apparatus 102 provides arming/enabling functionality such that the apparatus 102 can measure a signal either synchronously or asynchronously. The signal is fed to the channel input arming/enabling controls 120, 122, 124, and 126 to which event that a measurement is made. This is typically the pattern start signal. Counter/interpolators 128, 130, and 132 measure the time elapse between the start and stop events. A one-shot measurement is taken from the nth start (Nstart) data edge after the pattern start signal to the nth stop edge (Nstop) after the pattern start signal. Nstart and Nstop are integers. Interpolators typically provide fine time resolution down to 0.8 ps. In response to input controls 120, 122, 124, and 126, multiplexer 134 controls the counter/interpolators 128, 130, and 132 based on a clock 136 signal. Clock 136 is typically a precise crystal oscillator. A design for a measurement apparatus 102 provides arming/enabling functionality is disclosed in application Ser. No. 09/039,121, entitled "Analysis of Noise In Repetitive Waveforms," filed Mar. 13, 1998, which is hereby incorporated by reference. Such application is commonly assigned to the assignee of the present application.

The time between measurements is randomized. This is to ensure that the autocorrelation function performs correctly. This is random sampling in the statistical sense. An autocorrelation function is defined as the multiplication of a signal and a time shifted replica of this signal mathematically or electrically, or both. Use of an autocorrelation function is a well known signal analysis technique. In one embodiment, the measurement apparatus 102 takes one-shot measurements over a random time interval of about 21 us to 25 us plus the measured time interval. An "and" function of the internal arm signal, which is randomized, and the external arm signal (pattern start) initiates a single one-shot time interval measurement.

The measurement apparatus 102 is provided with a serial data signal either at input 120 or input 122. This data signal must have a known pattern and it repeats. In fiber optic systems, this signal may be supplied by a optical to electrical converter.

The measurement apparatus 102 is provided with a pattern start signal either at input control 124 or input control 126. The pattern start signal has a transition that has an unambiguous relationship to an arbitrary data reference edge. It may come from the equipment under test or from a hardware-based pattern recognizer that "triggers" on a word which has one unique position in the data pattern.

In the exemplary embodiment of this invention, no bit clock is required or desired. In many cases, a low jitter bit clock is not available.

Those skilled in the art will recognize that the exemplary environment illustrated in FIG. 1 is not intended to limit the present invention. Indeed those skilled in the art will recognize that other alternative hardware environments may be used without departing from the scope of the present invention.

Figure 2:
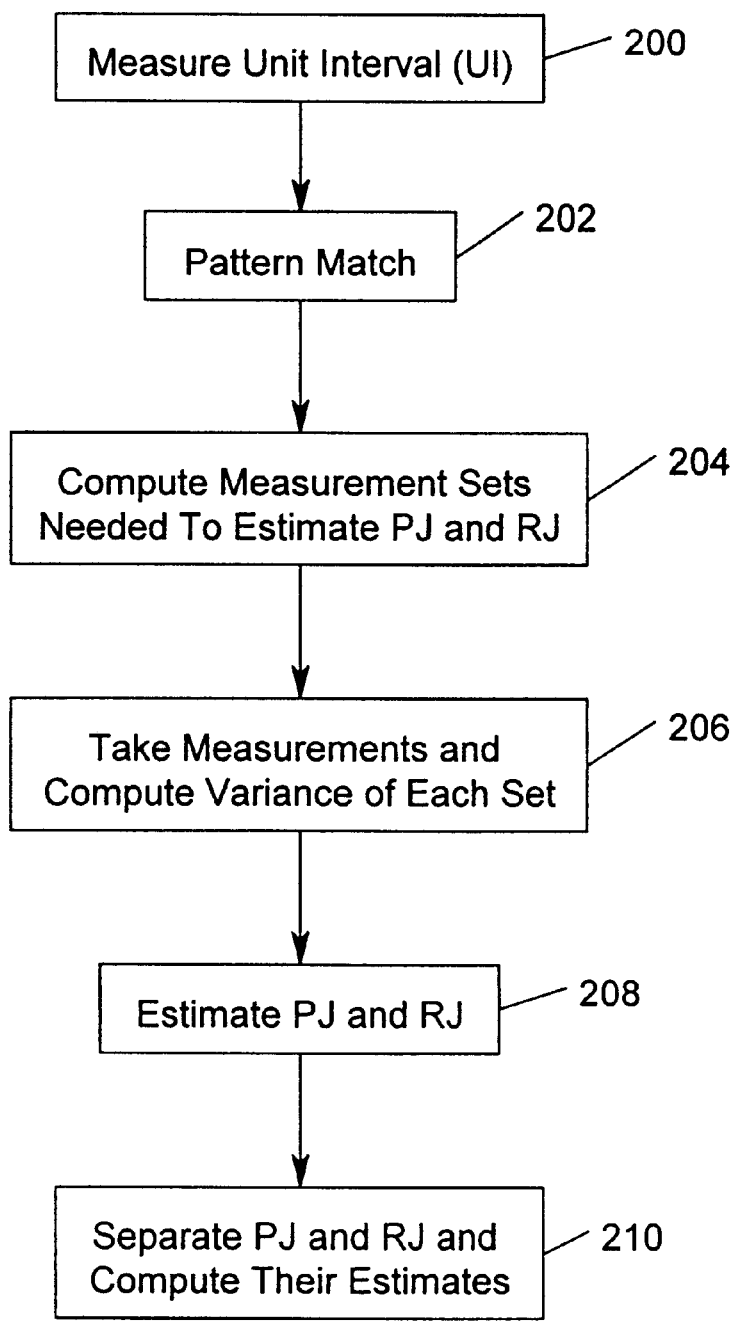
FIG. 2 is a flow diagram illustrating the steps performed by the analysis program according to an embodiment of the present invention.

FIG. 2 is a flow diagram illustrating the steps performed by the analysis program 106 according to one embodiment of the present invention. A method for measuring inter-symbol interference, duty cycle distortion, random jitter and periodic jitter is described.

Block 200 represents the analysis program 106 measuring the UI. This forms the basis for subsequent measurements and data analysis.

Block 202 represents the analysis program 106 pattern matching. The measured data is tested against an ideal image of the expected pattern. The analysis program 106 then estimates ISI+DCD.

Block 204 represents the analysis program 106 computing the measurement sets needed to estimate PJ and RJ.

Block 206 represents the analysis program 106 taking measurements of various data sets and computing the variance of each set. Although the statistical variance is used in the preferred embodiment described herein, those skilled in the art will recognize that other methods of measuring the variations in the measurements may be applied.

Block 208 represents the analysis program 106 running a FFT (Fast Fourier Transform). In another embodiment, a mask may be applied in order to model the jitter tolerance of serial data communications receiver. A jitter tolerance mask is a function that is defined in the frequency domain. A mask is used for modeling jitter rejection in receivers.

Block 210 represents the analysis program 106 separating the PJ and RJ and computing their estimates.

Figure 6:
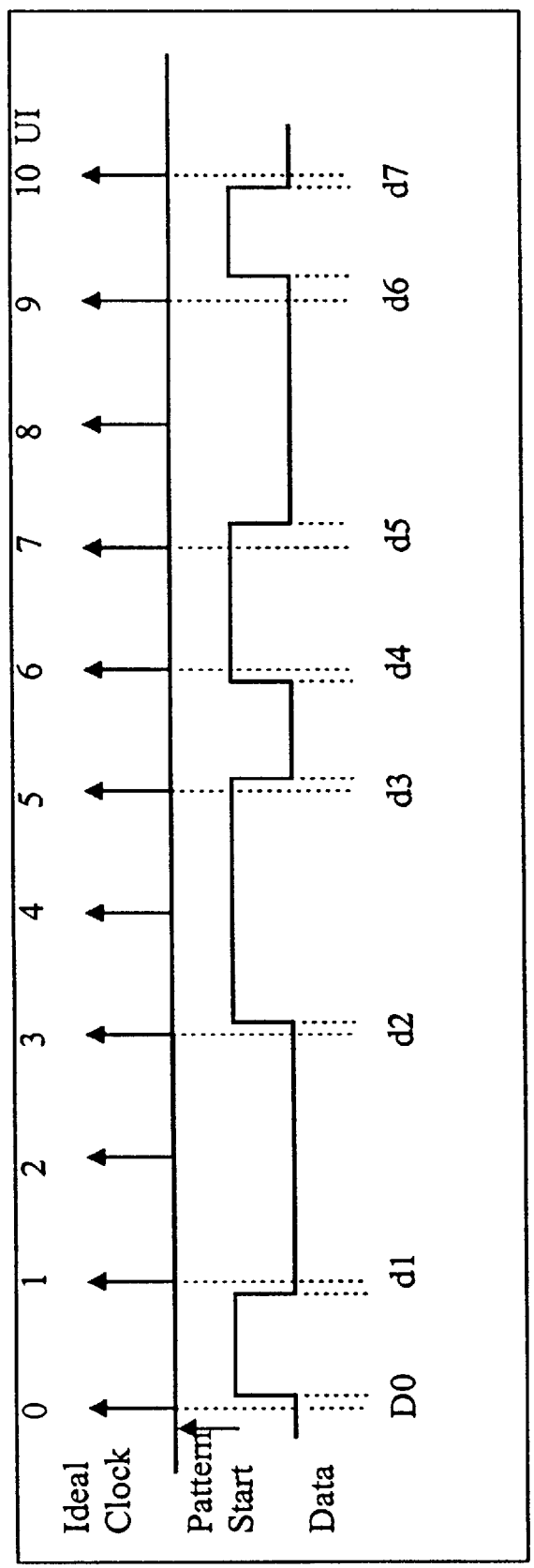
FIG. 6 is a graph of the displacement of actual data transitions relative to an ideal bit clock.

FIG. 6 is a graph of the displacement of actual data transitions relative to an ideal bit clock. The deltas in FIG. 6 are the differences in time from data transitions and active bit clock transitions. d0 is the delta associated with data edge 0; d1 is the delta associated with data edge 1, etc.

If a given data pattern is repeated many times, ISI+DCD will be static relative to a pattern boundary (reference edge 0). Each delta will be a constant. The serial data edge positions, for ISI+DCD, have converged to a steady state. However, ISI+DCD will have jitter relative to a bit clock. The deltas will not be the same value.

PJ and RJ will cause each delta to vary in time. The variance of these deltas over N (an integer>0) UI time intervals yields an autocorrelation function of PJ and RJ.

The means of the deltas allow an estimation of ISI+DCD. The variance of the deltas allows PJ and RJ estimations. In this way, ISI+DCD estimates may be separated from PJ and RJ estimates.

A modified version of the Blackman-Tukey method of signal analysis is used, as is well-known in the art. This allows the application of jitter tolerance masks to ensure compliance to data communication standards. An application of modified Blackman-Tukey autocorrelation function is demonstrated through FIG. 7 and the following discussion.

Figure 7:
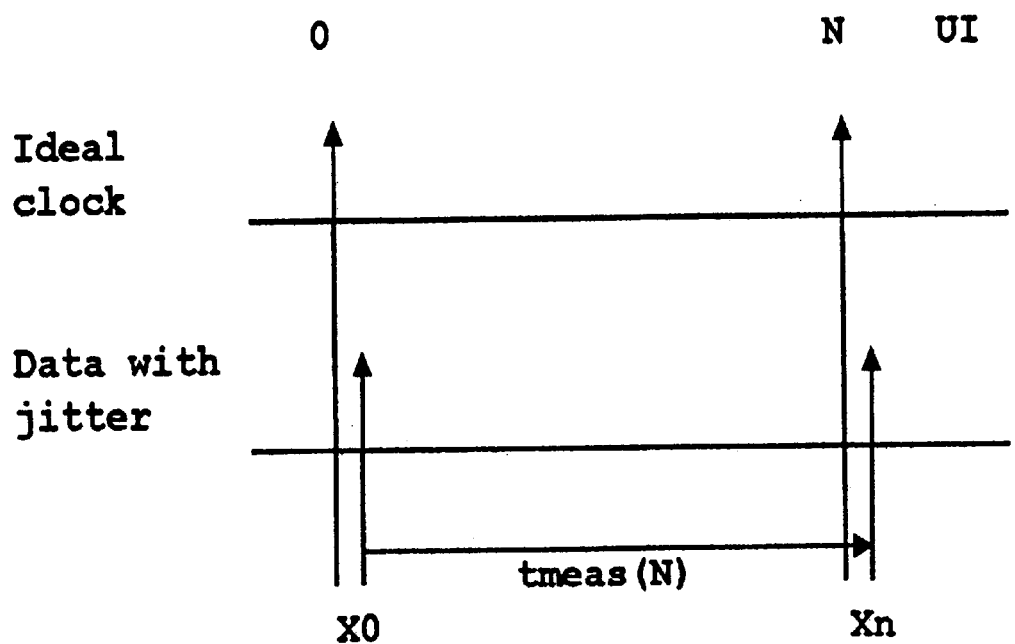
FIG. 7 is graph showing a one-shot time measurement.

FIG. 7 is a graph showing a one one-shot time measurement. FIG. 7 shows an enlarged view of one arbitrary edge transition to another arbitrary edge transition compared to an ideal bit clock. In one embodiment, the mathematical equations below are directed towards application on a Wavecrest DTS-2075, available from Wavecrest Corporation, Edina, Minn. Those skilled in the art will recognize that modifications to the mathematical equations will make the described embodiment applicable to other hardware instruments.

The one-shot measurement spans N*UI, where N is approximately an integer. A span is approximately N*UI or approximately N*T, where T is the signal period and N is an integer. X0 and Xn are the deltas for the jitter. As shown in FIG. 7, (1.1) tmeas(N)=N*UI+Xn−X0. M measurements on a randomized time schedule are taken for each N.

Therefore:

$$\text{Variance } (tmeas(N)) = \frac{1}{M-1} \sum_{k=1}^{M} [tmeas(N) - \overline{tmeas(N)}]^2 \quad (1.2)$$

$$\overline{tmeas(N)} = \frac{1}{M} \sum_{k=1}^{M} (N*UI + Xn - X0) \quad (1.3)$$

$$\overline{tmeas(N)} = N*UI + \frac{1}{M} \sum_{k=1}^{M} (Xn - X0) \quad (1.4)$$

If ISI+DCD is 'small' the mean of (Xn−X0) is small, then:

$$\overline{tmeas(N)} \cong N*UI. \quad (1.5)$$

Substitute into (1.2).

$$\text{Variance } (tmeas(N)) \cong \frac{1}{M-1} \sum_{k=1}^{M} (Xn - X0)^2 \quad (1.6)$$

$$\text{Variance } (tmeas(N)) \cong \frac{1}{M-1} \sum_{k=1}^{M} (Xn^2 + X0^2) + \quad (1.7)$$

$$\frac{1}{M-1} \sum_{k=1}^{M} (-2*Xn*X0)$$

The first term in (1.7) is constant as a function of N and the second term is −2 times the autocorrelation function of PJ and RJ, see (1.8).

$$\text{Variance } (tmeas(N)) \cong C - 2 * \left[ \frac{1}{M-1} \sum_{k=1}^{M} (Xn*X0) \right] \quad (1.8)$$

N*UI is τ(tau), the lag time of the autocorrelation function. The Fourier transform of the autocorrelation function from a signal gives the power spectral density of the signal.

When an FFT is performed on (1.8), the mean of the data record is forced to 0: This makes the value of C irrelevant. This is justified by the fact that PJ and RJ are not static, as they have no "DC" component.

UI Estimation

The signal analysis system 100 takes M1 (an integer) measurements of the start pattern signal and computes the mean and standard deviation. The mean is divided by the length of the pattern in UI (Lpatt), with the results being the UI estimate. The standard error of the mean may then be estimated using the standard deviation as follows: STD (measurements)/SQRT(M1). Typically, if the standard error of the mean is too large, increasing the number of measurements will reduce the error. This estimate will typically work well if M1>100. The estimate may be tested against a default or user-defined constant. For example, an acceptable error is defined by the data communications and/or telecommunications industry. Also, the error may be such that the accuracy of subsequent measurements is impaired. Increasing M1 may sufficiently reduce the error.

Pattern Match

Figure 3:
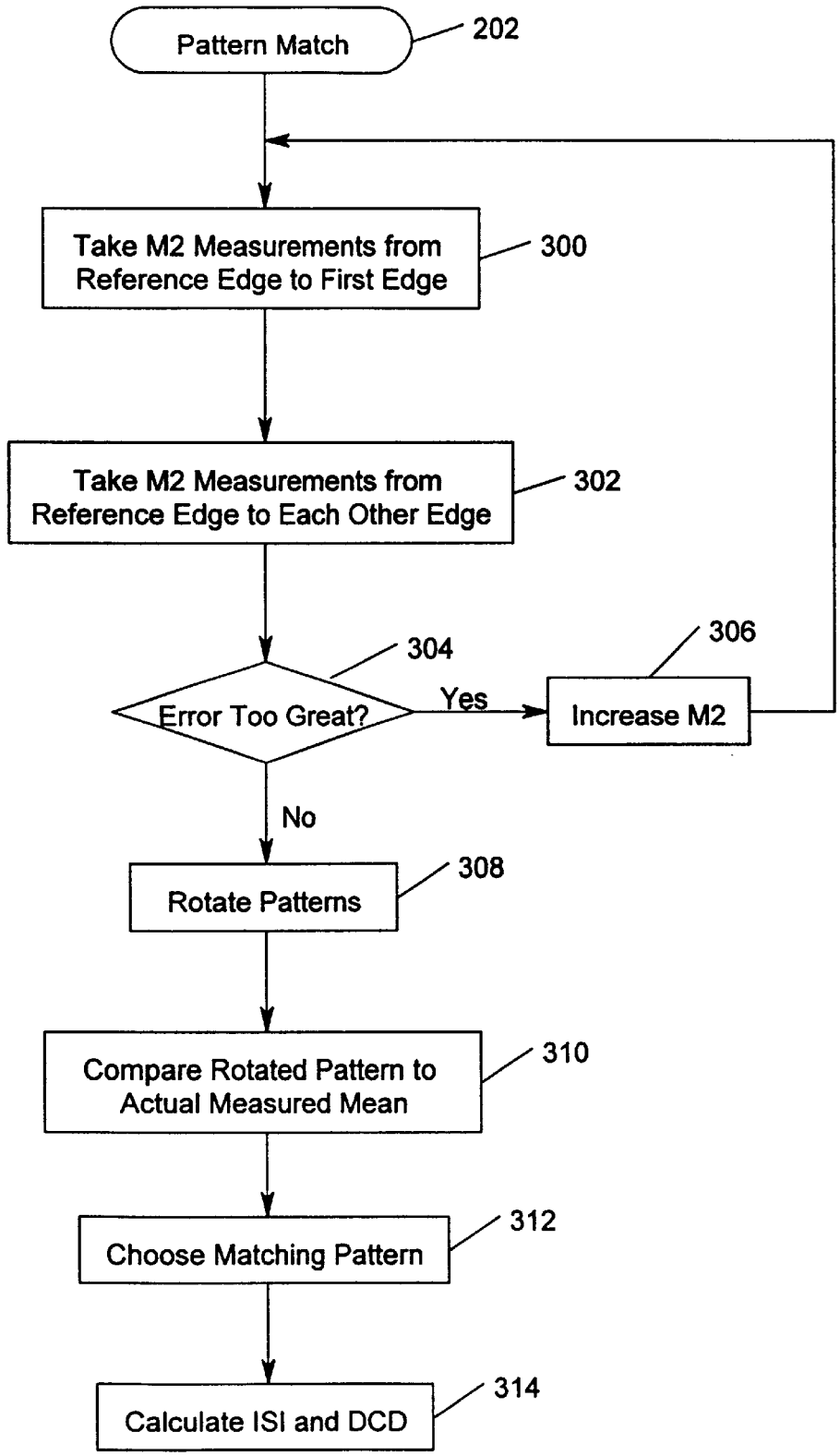
FIG. 3 is a flow diagram illustrating the steps performed by the analysis program 106 in determining a matching pattern.

The signal analysis system 100 compares measured data with an image of the expected pattern. The image of this pattern must be rotated to perform this match as the relationship between the start pattern signal and the reference data edge is arbitrary. The match uses a least square criteria. Those skilled in the art will recognize that other methods of performing the match may be used. Generally, the match may be found using any measure of error between the actual measured pattern and the rotated image. FIG. 3 is a flow diagram illustrating the steps performed by the analysis program 106 according to one embodiment of the present invention in determining a matching pattern. It will be appreciated that the processor 108 acts on program steps as set forth in the flow diagrams in order to implement the method in accordance with the principles of the invention. In the preferred embodiment, such program is, written in C. However, the program can be written in a number of other languages, including C++ and FORTRAN.

Block 300 represents the analysis program 106 taking M2 measurements from data edge 0 (reference edge) to data edge 1. The mean and error of the mean are computed. The error of the mean is tested against a default or user-defined constant.

Block 302 represents the analysis program 106 repeating the steps represented by block 300 for edge 0 to edge 2, edge 0 to edge 3 . . . edge 0 to edge (end−1), where "end" is the number of the edge where the pattern repeats.

Block 304 is a decision block representing the analysis program 106 testing if the error of the mean of the measurements taken is too great. For example, the error of the mean is compared to a default or user-defined constant. If so, block 306 represents the analysis program 106 increasing M2 and returning to block 300 and repeating the measurements; otherwise, the pattern is rotated as represented by block 308. The error may be too great especially in the presence of large amounts of PJ and RJ. Increasing M2 may allow this test to pass. Typically, M2 will be greater than 100.

Block 308 represents the analysis program 106 rotating the patterns as described below.

Block 310 represents the analysis program 106 comparing each rotated pattern to the actual measured mean by finding the sum of the squares of the errors as described below.

Block 312 represents the analysis program 106 choosing the best pattern match as described below.

Block 314 represents the analysis program 106 calculating the ISI and DCD based on the pattern match as described below.

Figure 8:
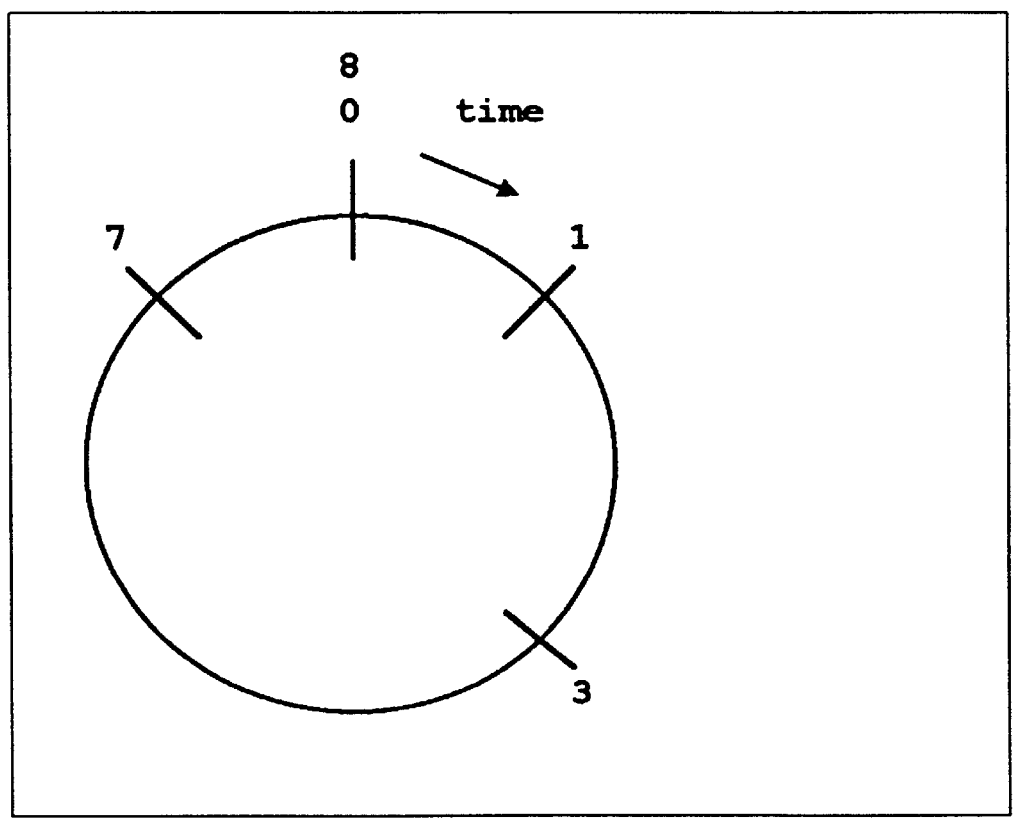
FIG. 8 is diagram of a simple repetitive ideal pattern.

FIG. 8 is diagram of edge transitions vs. time for an ideal repetitive pattern. All the edge transitions are integer boundaries. No jitter is present. The following material describes a pattern image, rotations and a pattern match of one embodiment, as represented by blocks 308, 310, and 312 of FIG. 3. Time moves CW(clock-wise) as shown by the arrow. The numbered lines represent edge (transition) positions in UI (Unit Interval).

The top of the circle in FIG. 8 is the reference position of the pattern. This pattern starts on position 0 and ends on position 8. Eight (8) is the length of the pattern (Lpatt) in UI. This pattern is described by the set: [0 1 3 7 8].

This pattern has 4 edges (end=4). The start and end positions are counted as one edge. From above: edge number 0 is the reference edge at 0 UI, edge number 1 at 1 UI, edge number 2 at 3 UI, etc. The number of edges in a pattern must always be even, otherwise its' start and end edges would have opposite polarities.

In the above circle shown in FIG. 8, no polarities are shown. However, assume that a positive (+) transition occurs at 0 UI, negative (−) at 1 UI, +at 3 UI, −at 7 UI and +at 8 UI. The pattern has repeated. A general way of looking at patterns is to ignore polarity. This allows pattern definitions on both inverted and non-inverted data without concern about polarities.

The above circle of FIG. 8 displays no jitter. All of the edges have integer UI positions and they will have zero displacements relative to ideal bit clock transitions.

Figure 9A:
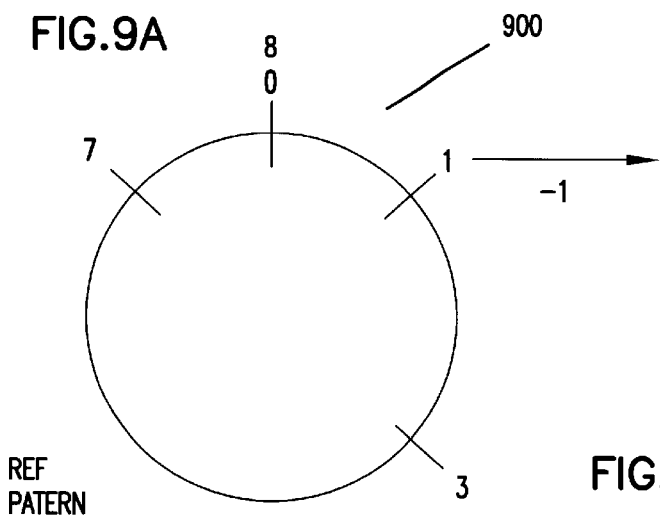
FIGS. 9a–9d are graphs of rotations of a simple pattern.
Figure 9B:
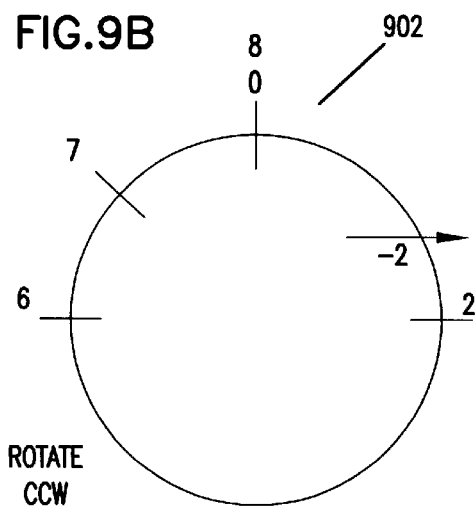
Figure 9C:
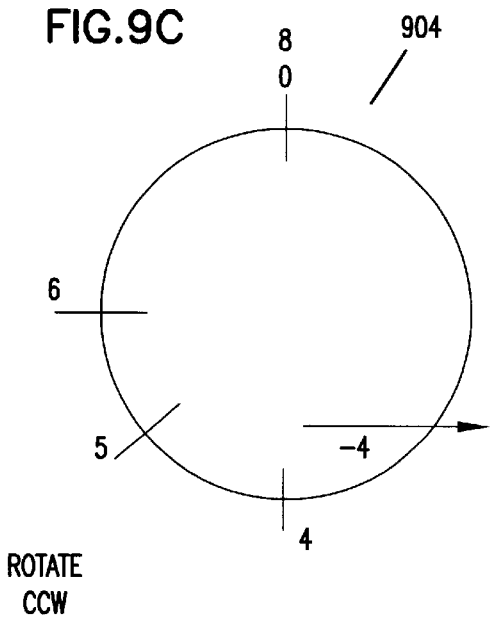
Figure 9D:
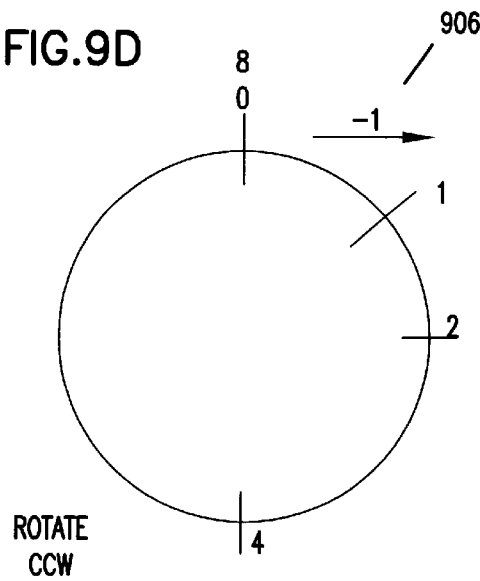
Figure 10A:
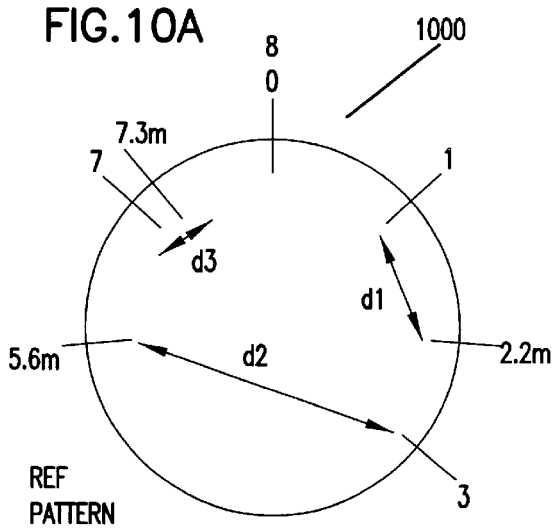
FIGS. 10a–10d are graphs of rotations with measured data.
Figure 10B:
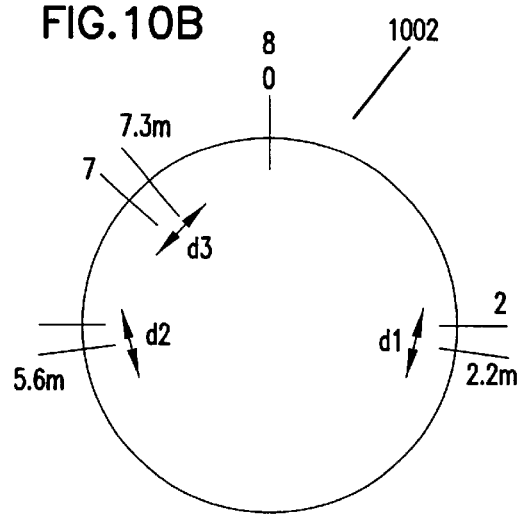
Figure 10C:
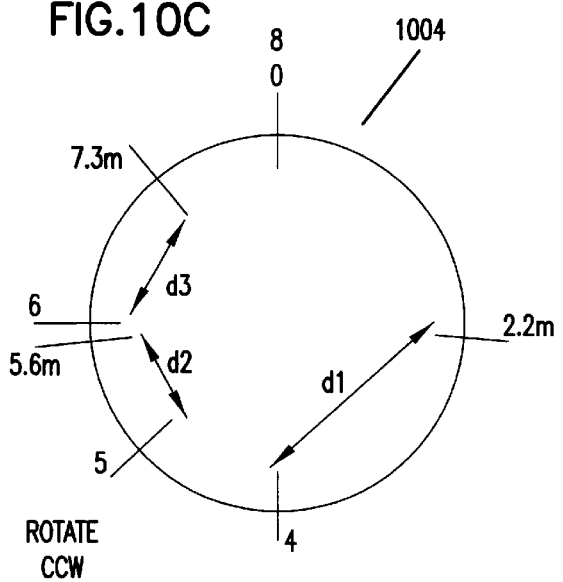
Figure 10D:
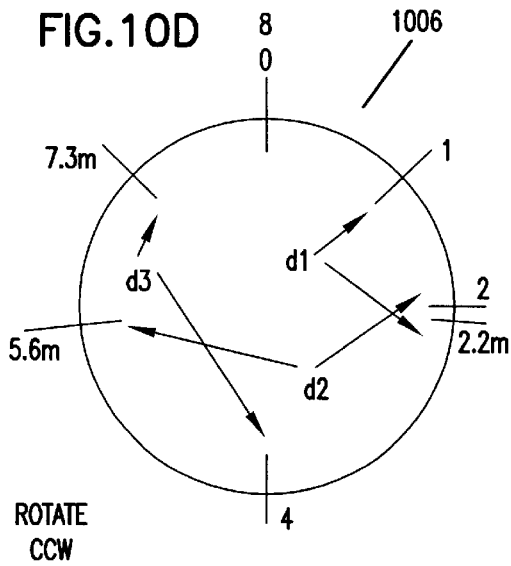

FIGS. 9a–9d are exemplary graphs showing rotations of a simple pattern, as represented by Block 308 of FIG. 3. The reference pattern [0 1 3 7 8] as represented by circle 900 in FIG. 9A is rotated CCW 1 edge number by subtracting the edge position of the first edge after the reference position from all of the edge positions. In this case, subtract 1. This results in circle 902 of FIG. 9b defined as [0 2 6 7 8]. Edge numbers: [0 1 2 3 4] The rotation of the initial pattern results in the following circles: [0 1 3 7 8] 900, [0 2 6 7 8] 902, [0 4 5 6 8] 904 (FIG.9c), and [0 1 2 4 8] 906 (FIG. 9d). All of these circles 900, 902, 904, and 906 of FIGS. 9a–9d come from the same pattern. Only the reference edge has changed. It is noted that the transitions are independent of plus or minus edges in that a match will occur regardless of edge polarity. One more rotation will result in [0 1 3 7 8], the initial circle 900. Four rotations of the initial pattern (the number of edges in the pattern) will yield the initial pattern.

FIGS. 10a–10d are exemplary graphs of rotations with measured data. The rotated patterns of circles 1000, 1002, 1004, and 1006 (shown in FIGS. 10a–10d, respectively) are compared to the actual measured means, as represented by block 310 of FIG. 3. The measured means 2.2 m, 5.6 m and 7.3 m are placed on the four possible rotations of the pattern [0 1 3 7 8]. These measured means are from the reference edge to the first, second and third edges.

As represented by block 312 of FIG. 3, the goal is to find out which rotation of the pattern will match the measured data. The ith delta, where i is the edge number, is the ith ideal position minus the ith measured mean. The deltas are squared and then summed for each rotation. The "match" rotation has the smallest sum (S).

[0 1 3 7 8] $S$=square(1.0−2.2)+square(3.0−5.6)+square(7.0−7.3)= 8.29

[0 2 6 7 8] $S$=square(2.0−2.2)+square(6.0−5.6)+square(7.0−7.3)= 0.29

[0 4 5 6 8] $S$=square(4.0−2.2)+square(5.0−5.6)+square(6.0−7.3)= 5.29

[0 1 2 4 8] $S$=square(1.0−2.2)+square(2.0−5.6)+square(4.0−7.3)= 25.29

[0 2 6 7 8] is the rotation that matches: it has the smallest sum. The quality of the match may be found by computing the standard deviation of the deltas that have the least sum. Typically, using many random data patterns and large amounts of jitter (ISI+DCD), a standard deviation less than 0.5 UI is a very good match.

Block 314 represents the calculation of ISI and DCD. The estimate for ISI+DCD peak to peak is:

MAX[−MIN(deltas), (MAX(deltas)−MIN(deltas)),MAX (deltas)] The deltas are the set of deltas computed from the matched pattern. In the above equation, the −MIN(deltas) and the MAX(deltas) are needed when d0 (the reference edge delta) is at the lower or upper extreme of the overall delta distribution. Those skilled in the art will recognize that these simple illustrations are for exemplary purposes only. A typical signal may have hundreds or thousands of transitions in the pattern.

Compute Measurement Sets for Variance To Estimate PJ and RJ

Figure 4:
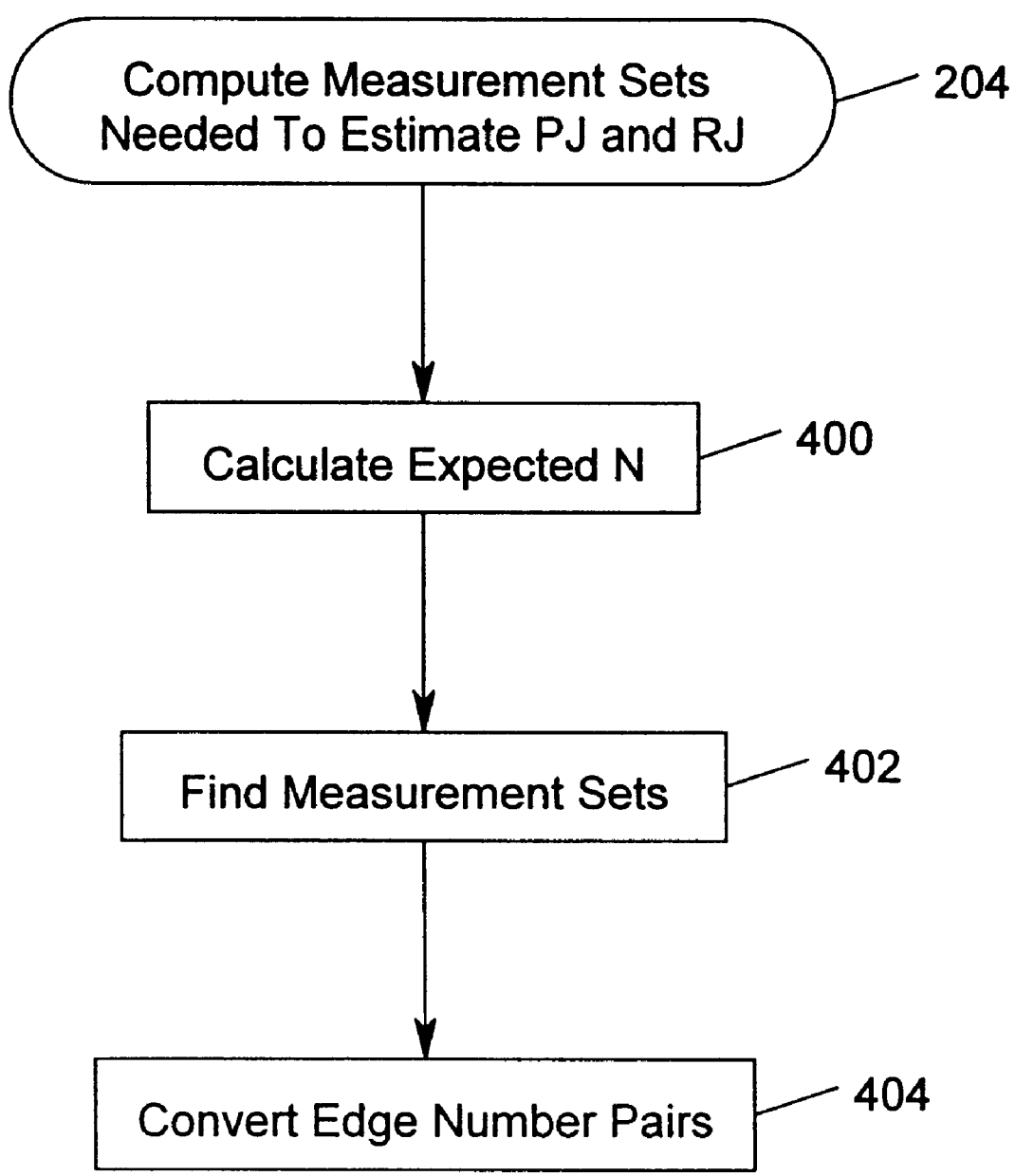
FIG. 4 is a flow diagram illustrating the steps performed by the analysis program 106 in computing measurement sets for a variance.

FIG. 4 is a flow diagram illustrating the steps performed by the analysis program 106 according to one embodiment of the present invention in computing measurement sets for a variance. The signal analysis system 100 computes measurement sets for Variance(tmeas(N)) (called VAR(N)) using the edge positions from the matched pattern. VAR(N) is used to feed data to the FFT, which provides PJ and RJ data.

Those skilled in the art will recognize that other measurements of the variations in the measurements, such as peak to peak measurements or any statistical measure of variation, may be used instead of the statistic variance. The goal is to compute measurement sets such that only one set of measurements is taken for each N.

Block 400 represents the analysis program 106 calculating the expected N. In the equations shown below, "end" is the last edge number in a matched pattern. Lpatt is the length of the pattern in UI. p(i) is an ideal edge position in UI for edge i in the matched pattern. Given that p(end)=Lpatt, the expected N's are calculated from:

a. p(2*end)−p(0). p(2*end)−p(1).
   (2*end)−p(2) . . . p(2*end)−p(2*end−1).

b. p(2*end−1)−p(0). p(2*end−1)−p(1).
   p(2*end−1)−p(2) . . . p(2*end−1)−p(2*end−2).

c. p(2*end−2)−p(0). p(2*end−2)−p(1).
   p(2*end−2)−p(2) . . . p(2*end−2)−p(2*end−3).

. . .
. . .

zzz. p(1)−p(0).

Block 402 represents the analysis program 106 finding, from all of the combinations found represented by the steps in block 400, measurement sets which "cover" N from 1 to Lpatt and have only one measurement set for each N. Each measurement set will have a unique edge pair and an expected N. Some patterns will not cover all N: there will be "holes" (gaps). The hole locations are stored.

Block 404 represents the analysis program 106 converting the edge number pairs into a hardware-specific format, if necessary. For example, in an embodiment described herein, the analysis program 106 is implemented through the Wavecrest DTS-2075, available from Wavecrest Corporation, Edina, Minn. In the DTS-2075, the data represented by the steps described in block 402 are converted to Nstart +/− and Nstop +/− for the arm on nth event counters. Those skilled in the art will recognize the applicability of similar conversions when implementing the analysis program 106 according to this invention in other hardware embodiments. For example, although the steps performed by the analysis program 106 in analyzing the jitter of the serial data communication signal are polarity independent, the actual signal has a polarity which is determined with respect to the hardware measuring the signal.

Take M3 Measurements of Each Edge Pair

As represented by block 206, the signal analysis system 100 takes M3 measurements for each edge pair and calculates the variance and mean of each set. The mean is tested against expected N. The VAR(N) in stored in location: "expected N" for that particular pair. Interpolated data is used to "fill holes" (if any). A VAR(N) record has been created. This record is an autocorrelation function of PJ and RJ.

Run the FFT

Figure 5:
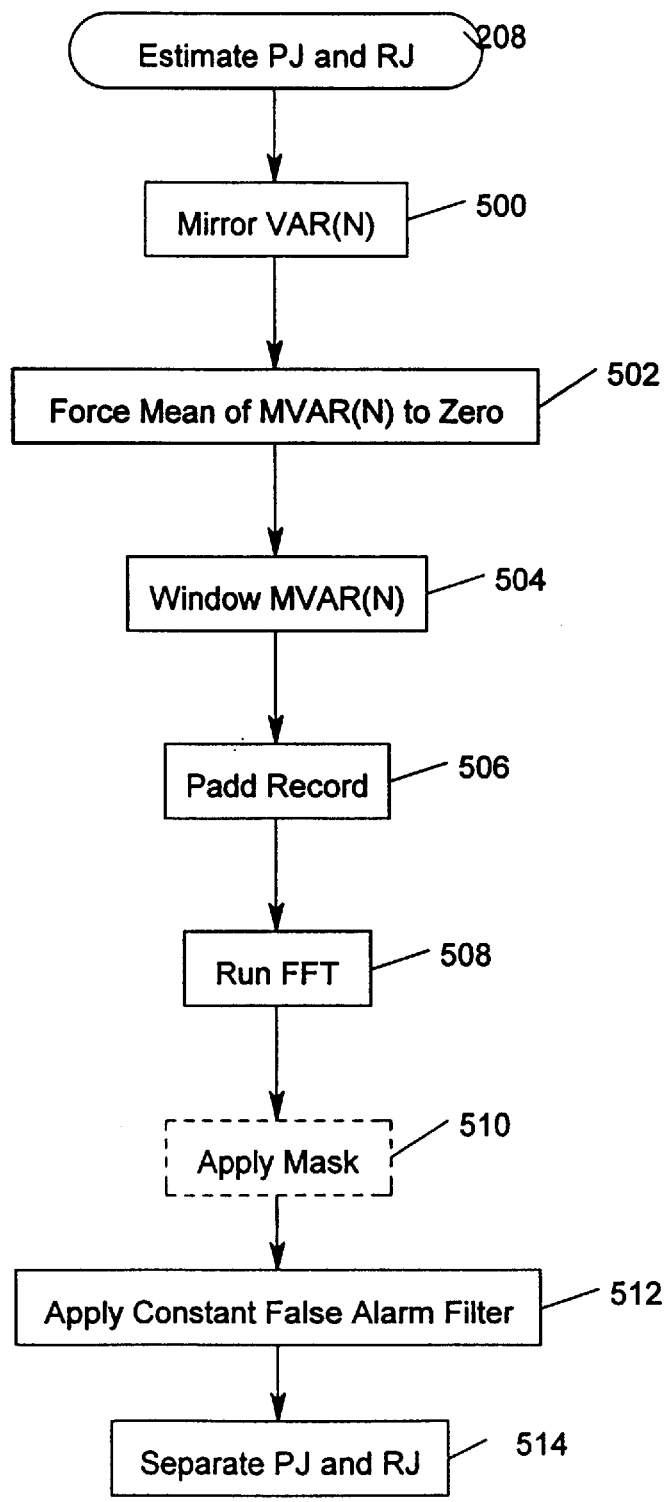
FIG. 5 is a flow diagram illustrating the steps performed by the analysis program 106 in running a FFT on the autocorrelation function.

FIG. 5 is a flow diagram illustrating the steps performed by the analysis program 106 according to one embodiment of the present invention in running a FFT on the autocorrelation function determined in block 206. This will provide RJ and PJ information. Taking the FFT of the autocorrelation function of a signal is the basis of a modified version of the Blackman-Tukey signal analysis method. In one embodiment of this invention, the analysis program 106 uses this method to estimate PJ and RJ. Generally, those skilled in the art will recognize that other methods of transforming the function from the time domain to the frequency domain may also be applied.

Block 500 represents the analysis program 106 determining mirror VAR(N) to create MVAR(N). Var(0) is set to zero. The mirror function makes use of the symmetry of VAR(N) around N=0. VAR(N)=VAR(−N). This nearly doubles the length of the VAR(N) record and this improves the frequency resolution of the FFT output.

Block 502 represents the analysis program 106 forcing the mean of MVAR(N) to zero.

Block 504 represents the analysis program 106 determining Window MVAR(N). The Blackman-Tukey method usually uses a triangular window. Those skilled in the art will recognize that other windows such as a Kaiser-Bessel, Gaussian, or others may also be used.

Block 506 represents the analysis progam 106 determining the Padd of the record. This improves the FFT's resolution and accuracy. Padd is also known as zero augmentation.

Block 508 represents the analysis program 106 running the FFT. A radix 2 FFT is usually used.

Block 510 represents the analysis program 106 using a mask to weigh the FFT output as a function of frequency. Generally, serial data communication systems are more tolerant of low frequency jitter than high frequency jitter. This step is optional.

Block 510 represents the analysis program 106 applying the constant false alarm filter as described below.

Block 514 represents the analysis program 106 separating RJ And PJ as set forth below.

Separate PJ and RJ

The signal analysis system 100 adds amplitudes of the PJ spectral lines to give the magnitude of PJ in peak UI. The signal analysis system 100 sums the RJ curve and take the square root to estimate RJ expressed as a standard deviation in UI's.

In one embodiment according to the present invention, the method of separating PJ and RJ uses a technique called a constant false alarm filter that is used in radar. In video use this is also called a median filter. It consists of a sliding window that is applied to the FFT output bins. This window has a odd number of bins. For example, for a window having 9 bins the lower 4 and upper 4 bins are averaged. If the central bin is larger than this average by a defined ratio, the magnitude and position of the central bin is stored away and later used to identify the spectral lines created by PJ. The window is moved over one bin and this process is repeated until the all of the FFT output bins have been processed.

Figure 11:
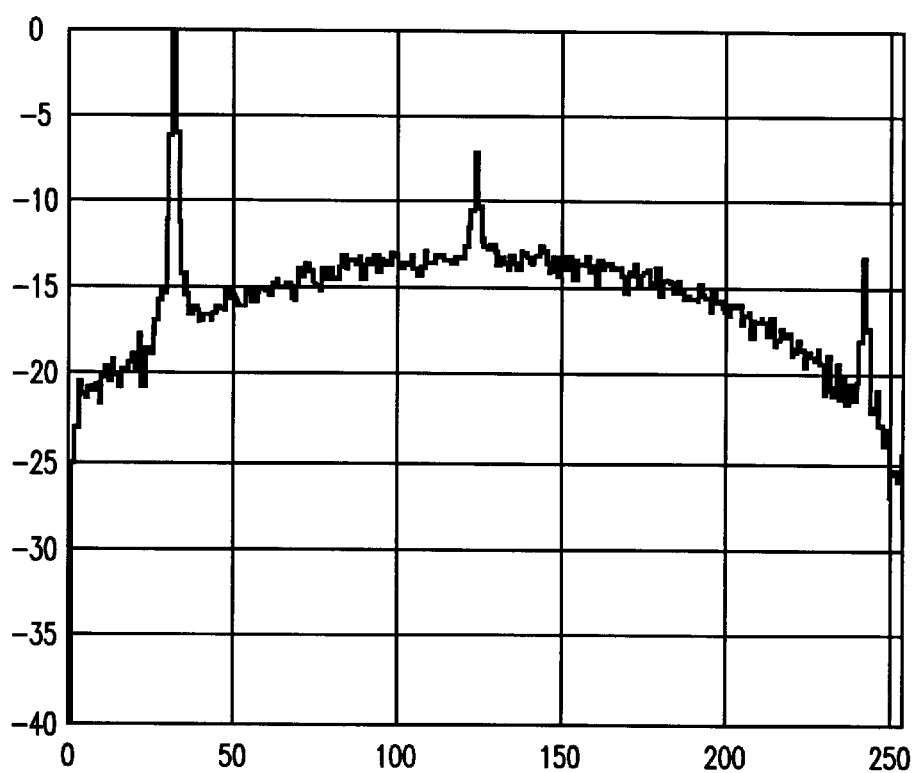
FIGS. 11 and 12 are diagrams illustrating the application of a constant false alarm filter.
Figure 12:
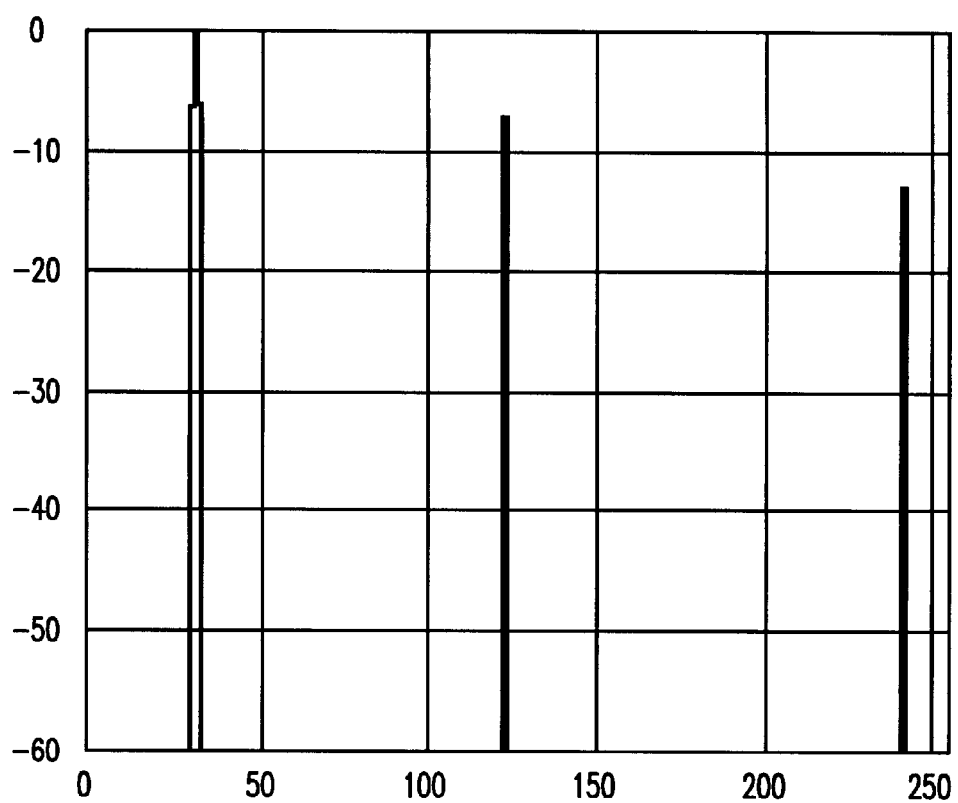

FIGS. 11 and 12 are diagrams illustrating the application of a false alarm filter. FIG. 11 displays the raw output of an FFT of PJ and RJ. This provides the input to the false alarm filter. The vertical axis is in dB and the horizontal axis is frequency. The spectral peaks in the display are PJ and the underlying envelope in the display is RJ. At this point, the FFT raw data may be multiplied by a jitter tolerance mask for standards testing. The constant false alarm filter is applied.

FIG. 12 displays the output of the constant false alarm filter output. The sliding window of the filter has a width of 9 bins. The magnitude and frequency of each PJ spectral line has been isolated from RJ. An estimate of the total PJ is the algebraic sum of the spectral line magnitudes. This gives an estimate of total PJ in peak UI or seconds.

An estimate of RJ is calculated by removing the spectral lines from the FFT raw data. The magnitude of the bins are summed and a square root is taken. The result is a one-sigma estimate of RJ in UI or seconds.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of analyzing jitter in a signal having transitions which define spans over a time interval, the jitter having a random component and a periodic component, comprising the steps of:

(a) identifying a reference edge;

(b) obtaining a plurality of measurements for a plurality of spans, wherein each span comprises more than one edge and begins a first number of edges away from the reference edge and ends a second number of edges away from the reference edge;

(c) generating variation estimates for the measurements for each of the spans;

(d) transforming the variation estimates from a time domain to a frequency domain, and (e) determining the random component and the periodic component of the jitter signal.

2. The method of claim 1, wherein the determining step comprises the step of applying a constant false alarm filter to the frequency domain variation estimates to separate the random component and the periodic component.

3. The method of claim 2, wherein the transforming step is performed through a FFT.

4. The method of claim 2, further comprising the step of measuring the statistical confidence of the matching pattern.

5. The method of claim 1, wherein the variation estimates comprise variance estimates.

6. The method of claim 1, wherein one of the first numbers is zero.

7. A method of analyzing jitter in a signal having a repetitive data pattern comprising transitions which define spans over a time interval, the jitter having a random component and a periodic component, comprising steps of:

(a) identifying a reference edge;

(b) measuring a unit interval of the data pattern;

(c) determining a matching pattern;

(d) calculating a measurement schedule defining a measurement set for each span;

(e) obtaining a plurality of measurements for a plurality of spans, wherein each span comprises more than one edge and begins a first number of edges away from the reference edge and ends a second number of edges away from the reference edge;

(f) generating variation estimates for the measurements for each of the spans;

(g) transforming the variation estimates from a time domain to a frequency domain; and (h) determining the random component and the periodic component of the signal.

8. The method of claim 7, wherein the jitter comprises an ISI component and a DCD component, the determining a matching pattern step comprising the step of calculating ISI and DCD based on a comparison of the matching pattern and the measurements.

9. The method of claim 7, wherein the determining a matching pattern step further comprises the steps of:

rotating a reference pattern through a plurality of rotations;

comparing the rotations to the data pattern; and choosing the matching pattern.

10. The method of claim 9, wherein the comparing step comprises the step of comparing the rotations to the data pattern by the least-squared method.

11. The method of claim 7, wherein the determining the random component and the periodic component step comprises the step of applying a constant false alarm filter to the frequency domain variation estimates to separate the random component and the periodic component.

12. The method of claim 7, wherein the transforming step is performed through a FFT.

13. The method of claim 7, wherein the variation estimates comprise variance estimates.

14. The method of claim 7, further comprising the step of measuring the statistical confidence of the unit interval.

15. The method of claim 7, wherein one of the first numbers is zero.

16. An apparatus for analyzing jitter in a signal having a repetitive data pattern comprising transitions which define spans over a time interval, the jitter having a random component and a periodic component, the apparatus comprising:

(a) a measurement apparatus for collecting data;

(b) an analyzing unit, operatively connected to the measurement apparatus, for collecting data from the measurement apparatus, for identifying a reference edge, for measuring a unit interval of the data pattern, for determining a matching pattern, for calculating a measurement schedule defining a measurement set for each span, for obtaining a plurality of measurements for a plurality of spans wherein each span comprises more than one edge and begins a first number of edges away from the reference edge and ends a second number of edges away from the reference edge; for generating variation estimates for the measurements for each of the spans, for transforming the variation estimates from a time domain to a frequency domain; and for determining the random component and the periodic component of the signal.

17. The apparatus of claim 16, wherein the analyzing unit further comprises:

means for calculating ISI and DCD based on a comparison of the matching pattern and the measurements.

18. The apparatus of claim 16, wherein the analyzing unit further comprises:

means for applying a constant false alarm filter to the frequency domain variation estimates.

19. The apparatus of claim 16, wherein one of the first numbers is zero.

20. The apparatus of claim 16, wherein the jitter comprises an ISI component and a DCD component, wherein the analyzing unit calculates ISI and DCD based on a comparison of the matching pattern and the measurements.

21. The apparatus of claim 16, wherein the analyzing unit rotates a reference pattern through a plurality of rotations, compares the rotations to the data pattern, and chooses the matching pattern.

22. The apparatus of claim 16, wherein the analyzing unit compares the rotations to the data pattern by the least-squared method.

23. The apparatus of claim 16, wherein the analyzing unit comprises a constant false alarm filter for separating the random component and the periodic component.

24. The apparatus of claim 16, further comprising a FFT.

25. The apparatus of claim 16, wherein the variation estimates comprise variance estimates.

26. The apparatus of claim 16, wherein the analyzing unit measures the statistical confidence of the unit interval.

27. The apparatus of claim 16, wherein the analyzing unit measures the statistical confidence of the matching pattern.

28. An article of manufacture comprising a program storage medium readable by a computer having a memory, the medium tangibly embodying one or more programs of instructions executable by the computer to perform method steps for analyzing jitter in a signal having a repetitive data pattern comprising transitions which define spans over a time interval, the jitter having a random component and a periodic component, the method comprising the steps of:
   (a) identifying a reference edge;
   (b) measuring a unit interval of the data pattern;
   (c) determining a matching pattern;
   (d) calculating a measurement schedule defining a measurement set for each span;
   (e) obtaining a plurality of measurements for a plurality of spans, wherein each span comprises more than one edge and begins a first number of edges away from the reference edge and ends a second number of edges away from the reference edge; (f) generating variation estimates for the measurements for each of the spans;
   (g) transforming the variation estimates from a time domain to a frequency domain; and
   (h) determining the random component and the periodic component of the signal.

29. The article of claim 28, wherein one of the first numbers is zero.

30. The article of claim 28, wherein the jitter comprises an ISI component and a DCD component, the determining a matching pattern step comprising the step of calculating ISI and DCD based on a comparison of the matching pattern and the measurements.

31. The article of claim 28, wherein the determining a matching pattern step further comprises the steps of:
   rotating a reference pattern through a plurality of rotations;
   comparing the rotations to the data pattern; and
   choosing the matching pattern.

32. The article of claim 31, wherein the comparing step comprises the step of comparing the rotations to the data pattern by the least-squared method.

33. The article of claim 28, wherein the determining the random component and the periodic component step comprises the step of applying a constant false alarm filter to the frequency domain variation estimates to separate the random component and the periodic component.

34. The article of claim 28, wherein the transforming step is performed through a FFT.

35. The article of claim 28, wherein the variation estimates comprise variance estimates.

36. The article of claim 28, further comprising the step of measuring the statistical confidence of the unit interval.

37. The article of claim 28, further comprising the step of measuring the statistical confidence of the matching pattern.

* * * * *